United States Patent
Hsu et al.

(10) Patent No.: US 8,383,957 B2
(45) Date of Patent: Feb. 26, 2013

(54) PRINTED CIRCUIT BOARD

(75) Inventors: Shou-Kuo Hsu, Taipei Hsien (TW); Yung-Chieh Chen, Taipei Hsien (TW); Hsien-Chuan Liang, Taipei Hsien (TW); Wen-Laing Tseng, Taipei Hsien (TW); Shen-Chun Li, Taipei Hsien (TW); Chia-Nan Pai, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 297 days.

(21) Appl. No.: 12/875,156

(22) Filed: Sep. 3, 2010

(65) Prior Publication Data

US 2012/0048610 A1    Mar. 1, 2012

(30) Foreign Application Priority Data

Aug. 24, 2010   (TW) .............................. 99128175 A

(51) Int. Cl.
*H05K 1/11* (2006.01)

(52) U.S. Cl. ........ 174/266; 174/255; 174/260; 174/261; 174/262; 174/263; 174/264; 385/53; 428/209; 257/774

(58) Field of Classification Search .................. 174/266, 174/255, 260–264; 385/53; 428/209; 257/774
See application file for complete search history.

(56) References Cited

U.S. PATENT DOCUMENTS

| | | | | |
|---|---|---|---|---|
| 5,585,675 A | * | 12/1996 | Knopf ........................... | 257/774 |
| 6,010,769 A | * | 1/2000 | Sasaoka et al. ............... | 428/209 |
| 7,786,390 B2 | * | 8/2010 | Ikeda ............................ | 174/255 |
| 2008/0296056 A1 | * | 12/2008 | Kinoshita et al. ............ | 174/261 |
| 2012/0152607 A1 | * | 6/2012 | Chen et al. ................... | 174/266 |

* cited by examiner

*Primary Examiner* — Xiaoliang Chen
(74) *Attorney, Agent, or Firm* — Altis Law Group, Inc.

(57) ABSTRACT

A printed circuit board (PCB) includes two layers, two signal transmission traces, and a vertical interconnect access (via). The signal transmission traces are respectively arranged on the layers. The signal transmission traces are electrically connected to each other through the via. A centerline of the via with a vertical line of the layers form an acute angle θ, the angle θ is less than $\cos^{-1}[(Lv^2-Lt^2)/(Lv^2+Lt^2)]$. Wherein Lt is loss of the two signal transmitting traces in a unit length, and Lv is loss of the via in a unit length.

3 Claims, 4 Drawing Sheets

PRINTED CIRCUIT BOARD

BACKGROUND

1. Technical Field

The present disclosure relates to a printed circuit board.

2. Description of Related Art

Via stands for "vertical interconnect access" which is a vertical electrical connection between different layers of conductors in printed circuit board (PCB) design. Vias are pads with plated holes that provide electrical connections between copper traces on different layers of the PCB. Generally speaking, vias are vertical to the layers of the PCB, if a via is designed to a slantwise angle with the layers of the PCB, the signal transmission distance of the via and the corresponding copper traces will be reduced, which may reduce signal transmission loss. Therefore, there is room for improvement in the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
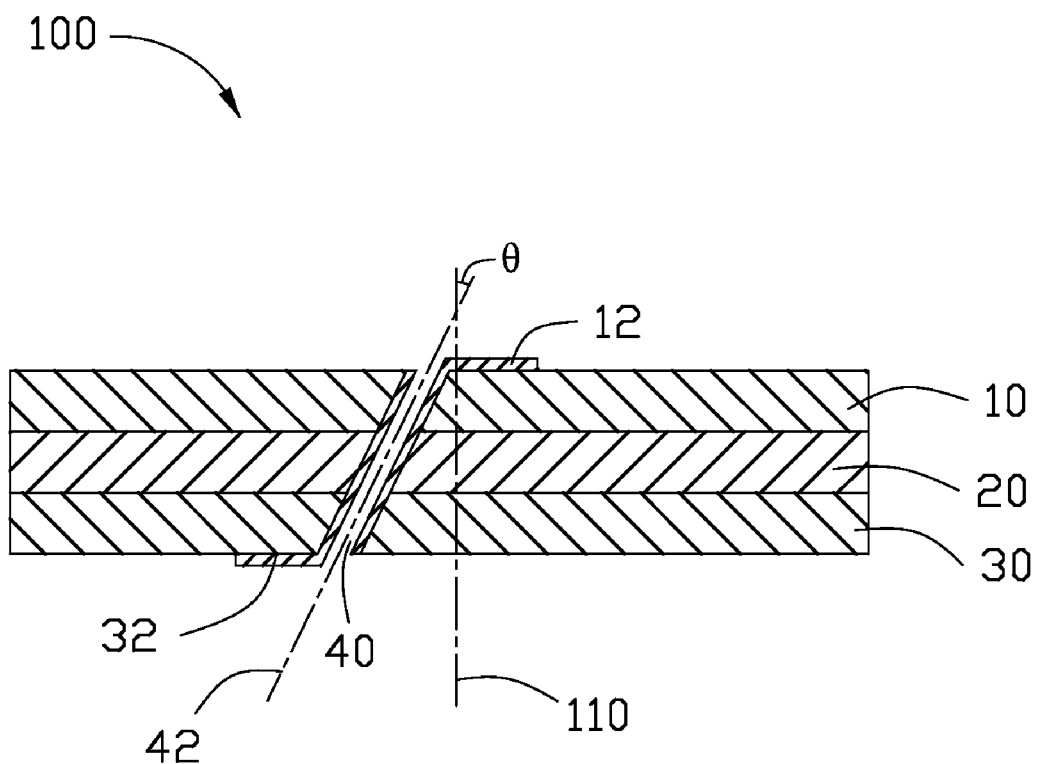
FIG. 1 is a cross-sectional, schematic view of an embodiment of a printed circuit board including a vertical interconnect access (via).

Referring to FIG. 1, an embodiment of a printed circuit board (PCB) 100 includes a first signal layer 10, a second signal layer 30, and a dielectric layer 20 sandwiched between the first signal layer 10 and the second signal layer 30. The first signal layer 10 includes a first signal transmission trace 12. The second signal layer 30 includes a second signal transmission trace 32. The first signal transmission trace 12 is electrically connected to the second signal transmission trace 32 through a vertical interconnect access (via) 40. A centerline 42 of the via 40 with a vertical line 110 of the PCB 100 form an acute angle $\theta$. The following paragraphs will describe design requirements of the acute angle $\theta$.

Figure 2:
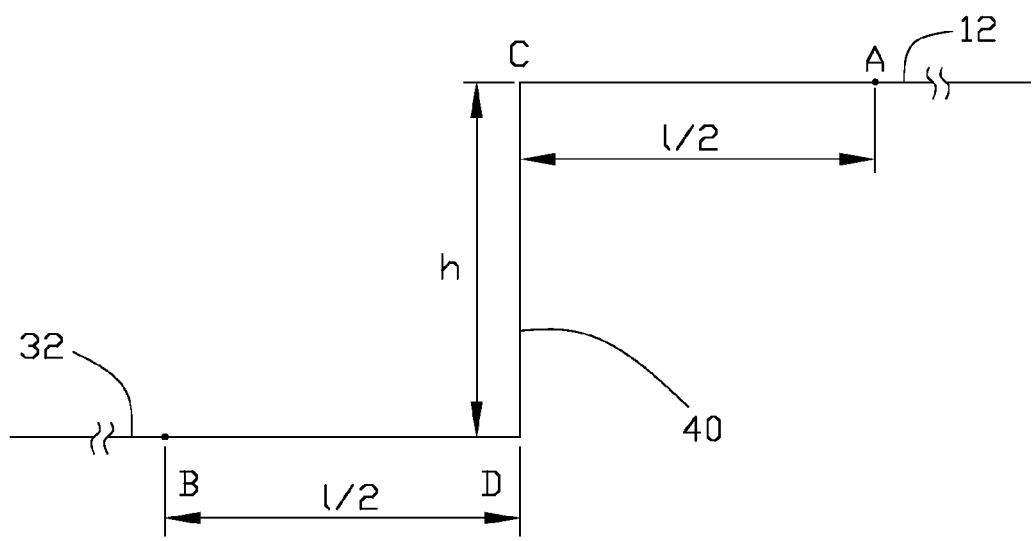
FIGS. 2-4 are equivalent, schematic diagrams for three different designs of the via of FIG. 1.
Figure 3:
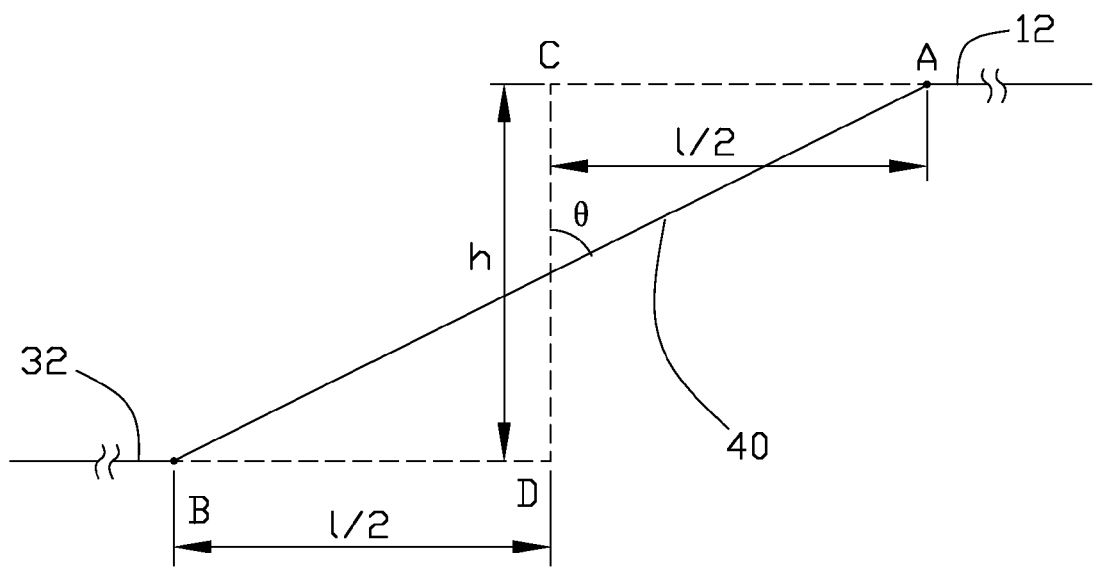
Figure 4:
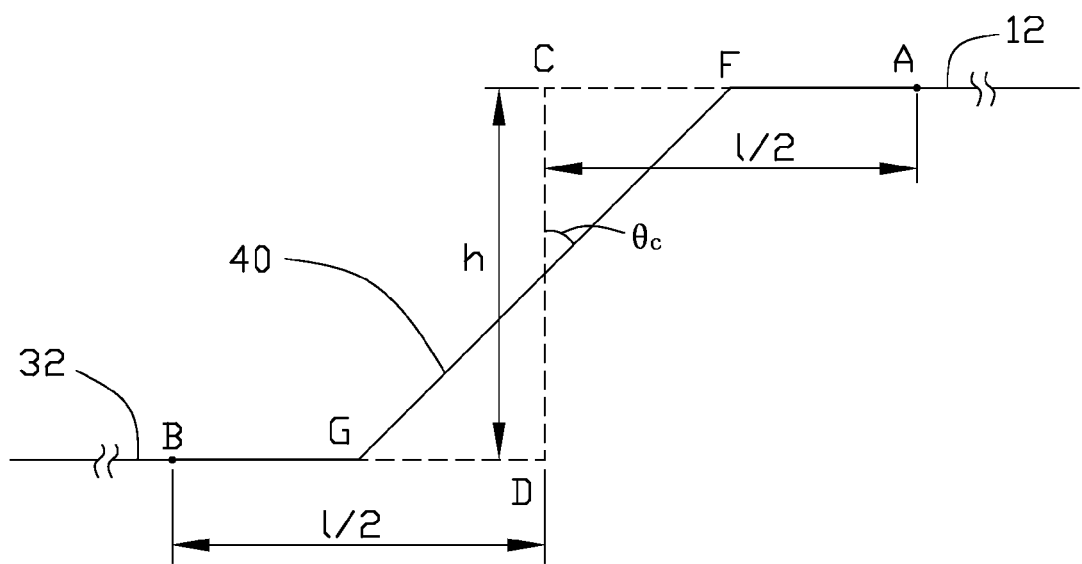

Referring to FIGS. 2-4, there are three different equivalent, schematic views for three different designs of the via 40, which are designed between a fixed point "A" of the first signal layer 10 and a fixed point "B" of the second signal layer 30. The sum of a horizontal distance between the fixed point "A" and the via 40 and a horizontal distance between the fixed point "B" and the via 40 is l. In a first design of FIG. 2, "AC" section stands for a part of the first signal transmission trace 12 and the length of the "AC" section is l/2. "BD" section stands for a part of the second signal transmission trace 32 and the length of the "BD" section is l/2. "CD" section stands for the via 40 perpendicularly connected between points C and D of the first and second signal transmission traces 12 and 32, and the length of the "CD" section is h (the perpendicular relationship of the "CD" section and the "AC" section just for calculating the design requirements of the acute angle $\theta$). There is a formula for signal transmission loss $\alpha 1$ of "ACDB" section: $\alpha 1 = Lt*l + Lv*h$, where Lt is signal transmission loss in the first and second signal transmitting traces 12 and 32 in a unit length, and Lv is signal transmission loss in the via 40 in a unit length. In the PCB 100, Lv>Lt.

In a second design of FIG. 3, "AB" section stands for the via 40 slantingly connected between points A and B of first and second transmission traces 12 and 32. There is a formula for signal transmission loss $\alpha 2$ of "AB" section: $\alpha 2 = Lv*h*\sec\theta$.

In a third design of FIG. 4, "AF" section stands for a part of the first signal transmission trace 12. "GB" section stands for a part of the second signal transmission trace 12. "FG" section stands for the via 40. Suppose an angle $\theta c$ is an optimum value of the angle $\theta$, and the loss of the signal transmitting traces 12 and 32 and the via 40 is at a lowest value. A loss difference between the signal transmission loss $\alpha 1$ and $\alpha 2$ is $\alpha(\theta)$. See the following formulas:

$$\alpha(\theta) = \alpha 1 - \alpha 2$$
$$= (Lt*l + Lv*h) - Lv*h*\sec\theta$$
$$= Lv*h*(1 - \sec\theta) + Lt*h*\tan\theta,$$

to differentiate $\alpha(\theta)$ and make the corresponding differential coefficient equal to zero.

$$\alpha(\theta)' = 0$$

$$-Lt*h*\sec 2\theta + Lv*h*\sec\theta*\tan\theta = 0$$

$$Lt/Lv = \sin\theta$$

$$\theta c = \sin^{-1}(Lt/Lv)$$

Sometimes, the angle $\theta$ may not be exactly designed to the optimum value $\sin^{-1}(Lt/Lv)$. For example, the angle $\theta$ may be adjusted according to requirements. However, the loss difference $\alpha(\theta)$ cannot be less than zero. Suppose an angle $\theta e$ is a maximal value of the angle $\theta$. The angle $\theta e$ can be calculated according to following formulas:

$$\alpha(\theta) = \alpha 1 - \alpha 2 = 0$$

$$(Lt*l + Lv*h) - Lv*h*\sec\theta = 0$$

$$\theta e = \cos^{-1}[(Lv^2 - Lt^2)/(Lv^2 + Lt^2)]$$

Where, Lt and Lv can be measured by some measuring devices or calculated according to following formulas:

$$Lt = 2.3 f*DF*\sqrt{\in_{e\!f\!f}} + 35.36*\sqrt{f}/(Z0W)$$

$$Lv = 0.11(R/Zv + G*Zv)$$

Where, "DF" stands for loss tangent, "f" stands for signal frequency, "W" stands for the width of the signal transmitting traces 12 and 32, "Z0" stands for characteristic impedance of the signal transmitting traces 12 and 32, "Zv" stands for characteristic impedance of the via 40, "R" stands for resistance of an equivalent circuit of the via 40 in a unit length, "G" stands for conductance of an equivalent circuit of the via 40 in a unit length, $\in_{e\!f\!f}$ stands for effective dielectric constant of the signal transmitting traces 12 and 32.

In actual design, if some conditions are satisfied, the angle $\theta$ equals to $\sin^{-1}(Lt/Lv)$. Therefore, the loss of the signal transmitting traces 12 and 32, and the via 40 is a lowest value, which can increase signal transmission quality. If some conditions are not satisfied to design the angle θ to $\sin^{-1}(Lt/Lv)$, the angle θ must be less than $\cos^{-1}[(Lv^2-Lt^2)/(Lv^2+Lt^2)]$.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB) comprising:
   two layers;
   two signal transmission traces respectively arranged on the layers; and
   a vertical interconnect access (via), wherein the signal transmission traces are electrically connected to each other through the via;
   wherein a centerline of the via with a vertical line of the layers form an acute angle θ, the angle θ is less than $\cos^{-1}[(Lv^2-Lt^2)/(Lv^2+Lt^2)]$, where Lt is signal transmission loss in a unit length of the signal transmitting traces, and Lv is signal transmission loss in a unit length of the via.

2. The PCB of claim 1, wherein the angle θ equals to $\sin^{-1}(Lt/Lv)$.

3. The PCB of claim 1, wherein $Lt=2.3f*DF*\sqrt{\epsilon_{eff}}+35.36*\sqrt{f}/(Z0W)$, $Lv=0.11(R/Zv+G*Zv)$, where "DF" stands for loss tangent, "f" stands for signal frequency, "W" stands for the width of the signal transmitting traces, "Z0" stands for characteristic impedance of the signal transmitting traces, "Zv" stands for characteristic impedance of the via, "R" stands for resistance of an equivalent circuit of the via in a unit length, "G" stands for conductance of an equivalent circuit of the via in a unit length, $\epsilon_{eff}$ stands for effective dielectric constant of the signal transmitting traces.

* * * * *